United States Patent
Jung

(10) Patent No.: US 8,748,980 B2
(45) Date of Patent: Jun. 10, 2014

(54) U-SHAPE RESURF MOSFET DEVICES AND ASSOCIATED METHODS OF MANUFACTURING

(75) Inventor: Jeesung Jung, San Jose, CA (US)

(73) Assignee: Monolithic Power Systems, Inc., San Jose, CA (US)

(*) Notice: Subject to any disclaimer, the term of this patent is extended or adjusted under 35 U.S.C. 154(b) by 279 days.

(21) Appl. No.: 13/216,187

(22) Filed: Aug. 23, 2011

(65) Prior Publication Data
US 2013/0049113 A1  Feb. 28, 2013

(51) Int. Cl.
*H01L 21/00* (2006.01)

(52) U.S. Cl.
USPC .................. 257/337; 257/335; 257/339

(58) Field of Classification Search
USPC .......................... 257/335, 337, 339
See application file for complete search history.

(56) References Cited

U.S. PATENT DOCUMENTS

| | | |
|---|---|---|
| 6,252,278 B1 | 6/2001 | Hsing |
| 6,518,138 B2 | 2/2003 | Hsing |
| 6,680,515 B1 | 1/2004 | Hsing |
| 8,026,549 B2 * | 9/2011 | Chen et al. ............. 257/335 |
| 2006/0220168 A1 | 10/2006 | Hsing |
| 2010/0301414 A1 | 12/2010 | Yoo |
| 2011/0057259 A1 | 3/2011 | Li |
| 2011/0062554 A1 | 3/2011 | Hsing et al. |
| 2011/0068377 A1 | 3/2011 | Hsing et al. |
| 2011/0068397 A1 | 3/2011 | Disney |
| 2011/0084333 A1 | 4/2011 | Disney et al. |

OTHER PUBLICATIONS

U.S. Appl. No. 12/728,044, filed Mar. 19, 2010.
U.S. Appl. No. 12/728,058, filed Mar. 19, 2010.
U.S. Appl. No. 12/980,143, filed Dec. 28, 2010.
U.S. Appl. No. 13/072,569, filed Mar. 25, 2011.
U.S. Appl. No. 13/092,699, filed Apr. 22, 2011.
U.S. Appl. No. 13/205,491, filed Aug. 8, 2011.

* cited by examiner

Primary Examiner — Laura Menz
(74) Attorney, Agent, or Firm — Perkins Coie LLP

(57) ABSTRACT

The present technology discloses a U-shape RESURF MOSFET device. Wherein the MOSFET device comprises a drain having a drain contact region and a drift region, a source, a body, a gate and a recessed-FOX structure. Wherein the recessed-FOX structure is between the gate and the drift region vertically and between the body and the drain contact region laterally, and wherein the recessed-FOX structure is configured to make the drift region into a U shape. The present technology further discloses the depth of the drift region is controlled by adjusting a layout width.

9 Claims, 9 Drawing Sheets

US 8,748,980 B2

U-SHAPE RESURF MOSFET DEVICES AND ASSOCIATED METHODS OF MANUFACTURING

TECHNICAL FIELD

The present invention generally relates to semiconductor device, and more particularly but not exclusively relates to Reduced Surface Field (RESURF) Metal Oxide Semiconductor Field Effect Transistor (MOSFET) devices.

BACKGROUND

RESURF technique is a well-known technique for increasing the breakdown voltage of a semiconductor device.

FIG. 1 shows a Lateral MOSFET device where a Field Oxide (FOX) isolation structure 11 is used to define a RESURF MOSFET as a prior art. The drain 12 comprises a drain contact region 120 and a drift region 121. The drift region 121 is between the channel 140 and the drain contact region 120. The FOX structure 11 reduces the surface field of the drift region 121 when a high gate voltage is applied, thus higher breakdown voltage is achieved. The RESURF breakdown voltage is proportional to the RESURF length in general. Thus power devices with high breakdown voltage always require long RESURF length and the cell pitch is big. It is not adapted to the miniaturization trend of the electronics devices. Moreover, the conduction resistance $R_{DSON}$ is not low due to the long drift region 121. It is desired that the RESURF length is long and the cell pitch of the drift region is small without adding to much cost.

Also, as one of the power device's key parameters, the charge density ($q/cm^2$) where the RESURF action occurs is related to the RESURF depth. The deeper the RESURF depth, the higher charge density is for a given doping profile. Therefore, the depth d1 of the drift region 121 is also an important parameter for the performance of the MOSFET device.

In the current approaches, the charge density is optimized by dose control and/or thermal recipes control. The specific thermal recipes control will affect the performance of other devices during the integration process. And the specific dose control or RESURF depth control requires additional mask which greatly adds to the cost. And meanwhile, the research development time for the conventional approaches is relatively long.

SUMMARY

In one embodiment of the present invention, a semiconductor device comprises a MOSFET device which comprises a drain, a source, a body between the drain and the source, a gate, a source and a recessed-FOX structure. Wherein the drain and the source are of a first doping type and the body is of a second doping type; the drain comprises a drain contact region and a drift region; the drain is at one side of the gate and the source is at another side of the gate; the recessed-FOX structure is between the gate and the drift region vertically and between the body and the drain contact region laterally, and wherein the recessed-FOX structure is configured to make the drift region into a U shape.

BRIEF DESCRIPTION OF THE DRAWINGS

Non-limiting and non-exhaustive embodiments are described with reference to the following drawings. The drawings are only for illustration purpose. Usually, the drawings only show part of the devices of the embodiments. These drawings are not necessarily drawn to scale. The relative sizes of elements illustrated by the drawings may differ from the relative size depicted.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 2:
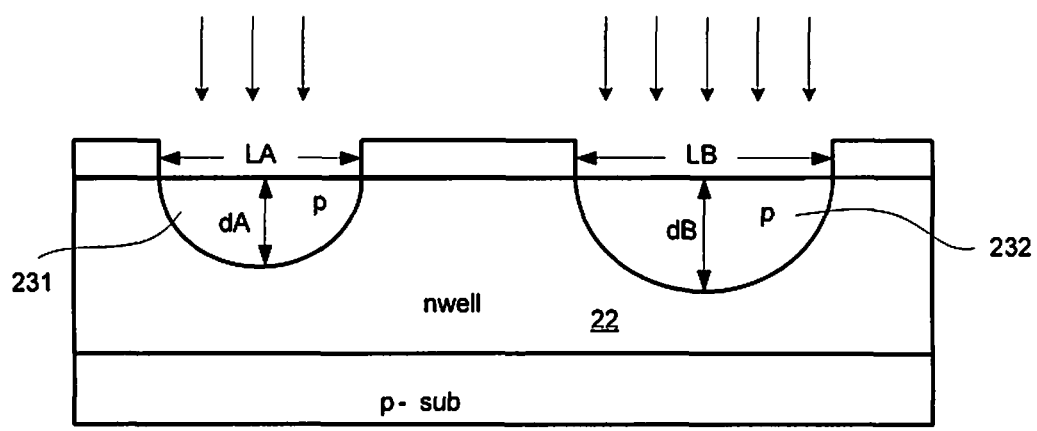
FIG. 2 shows a phenomenon during the semiconductor processing of well formation that the width of the implantation opening affects the implantation depth.

FIG. 2 shows a phenomenon during the semiconductor processing of well formation. Under a certain implantation condition, such as given the certain ion implantation dose, energy, tilt and thermal annealing recipes etc., the depth of the implanted well and the total dopant quantity has a positive relationship with the width of the mask opening. That is, the larger the mask opening is, the larger the implantation depth is. A mask opening is the opening patterned on a semiconductor surface through which the semiconductor processing is performed. Thus a mask opening (also called the layout opening) defines a pattern of a region on a semiconductor device.

Referring to FIG. 2, two Pwells 231 and 232 are formed under the same implantation condition in the Nwell 22. The first Pwell 231 is formed with a mask opening width (or called layout width) of LA and the Pwell 232 is formed with a mask opening width of LB wherein LA is narrower than LB. Accordingly, the implantation depth dA is shallower than the depth dB. With this characteristic, the desired depth of a well can be controlled by the layout width.

Figure 3:
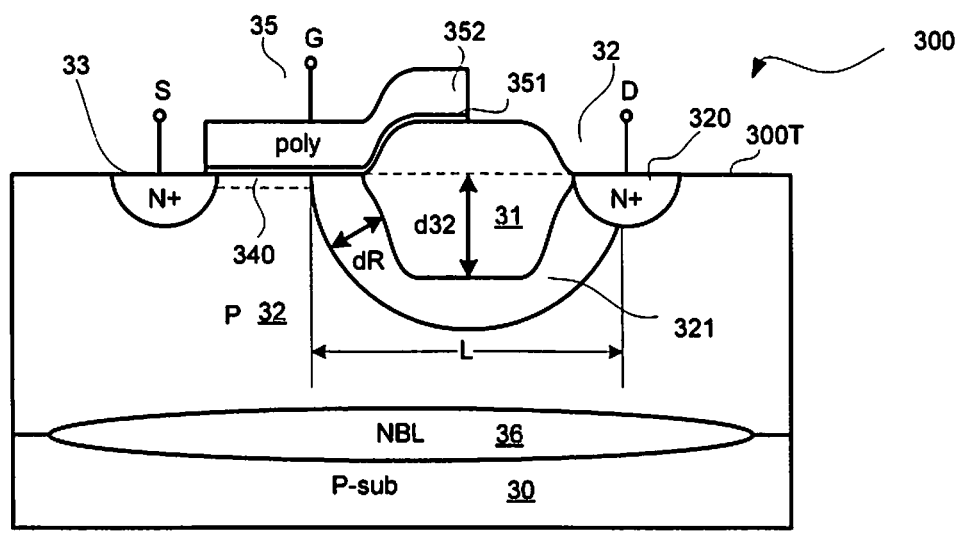
FIG. 3 shows a sectional view of a MOSFET device with a recessed FOX structure and a RESURF drift region according to an embodiment of the present invention.

FIG. 3 shows a sectional view of a RESURF MOSFET device 300 according to an embodiment of the present invention. The MOSFET device 300 comprises a P-type semiconductor substrate 30 at the bottom. In some embodiments, the substrate 30 is other than P doping type. In one embodiment, the substrate 30 is an N-type semiconductor. An N-type MOSFET (or called NMOS) device and other device/devices and/or circuit/circuits are integrated on the same semiconductor substrate 30. The MOSFET device 300 has a RESURF structure comprising an "U" shaped drift region 321 under a thick Field Oxide structure (or called FOX structure) 31. The FOX structure is made with performing an etching process in an Nwell to form a trench and then forming the thick oxide in the trench. This thick FOX structure is different from the oxide formed above the silicon surface. And such FOX structure formed in a trench which shares the same mask of forming the trench is called a recessed-FOX structure.

Specifically, the NMOS 300 comprises a drain 32, a source 33, a body 34 and a gate 35. The drain 32 is placed at one side of gate 35 (shown as the right side) and the source 33 is placed at the other side (left side) of gate 35, and both of the drain 32 and source 33 are of N type. Body 34 is of P type between drain 32 and source 33 and is under gate 35. Wherein a layer at the surface of body 34 near gate 35 forms the channel 340 of NMOS 300 during action. Gate 35 comprises an insulation layer 351 usually as an oxidation layer and an electrical conduction layer 352 usually as a polysilicon layer 352. The drain 32 comprises a drain contact region 320 which is led out as the drain terminal and a drift region 321 between channel 340 and drain contact region 320. Drift region 321 has a lower doping concentration than drain contact region 320. When a high voltage is applied to conduction layer 352 of gate 35, channel 340 is inverted into N type, and a current path is formed between source 33 and drain 32. When current flows between drain 32 and source 33, the conduction resistance between drain 32 and source 33 is depicted as $R_{DSON}$ which is affected by the doping concentration of drift region 321 and the length of drift region 321.

Figure 1:
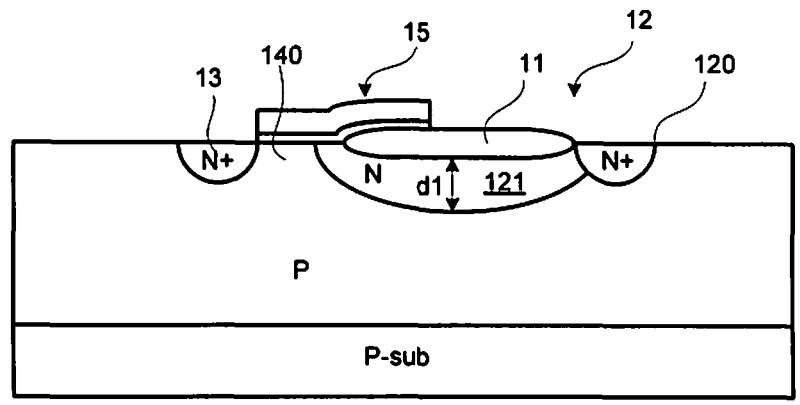
FIG. 1 shows a RESURF-LDMOS as a prior art.

NMOS 300 further comprises a thick recessed-FOX structure 31 between gate 35 and drift region 321. Thick recessed-FOX structure 31 with deep depth d32 is achieved with etching the silicon surface for a desired depth first and following the regular FOX recipe with an oxidation step. Thus the thick recessed FOX structure 31 has a substantially deeper oxide depth d32 than the thin film FOX structure as shown in FIG. 1 and makes the drift region 321 with a deep depth controlled by the layout width into a "U" shape. A RESURF length is the length of the boundary between the recessed-FOX structure 31 and a drift region. The U-shape drift region 321 results in a prolonged RESURF length while maintaining a small cell pitch. That is, the length of the curved boundary between the drift region 321 and the recessed FOX structure 11 is long while the width L of drift region 321 is small. The conduction carrier typically the electrons flow through the drift region 321 with a shortcut. Thus, under a certain cell pitch, the U-shape RESURF structure 31 leads to a higher breakdown voltage and lower $R_{DSON}$.

Moreover, under a fixed FOX depth d32, the depth dR of drift region 321 (or called the drift region depth) can be adjusted by the layout to optimize the charge density of the MOSFET device 300. This depth control is based on the principle as illustrated with reference to FIG. 2. The drift region depth dR may be adjusted by the layout width of drift region 321 wherein dR is adjusted with a positive relationship with the layout width of drift region 321. For a standard CMOS process, if a deep drift region depth dR is required for the optimum RESURF action for controlling its charge, the layout width for the drift region 321 should be larger, and accordingly higher breakdown voltage and lower $R_{DSON}$ can be achieved at the same time. The large layout width is represented by a large width L of the drift region 321 (or called the drift region width L) since the pattern of a well is a copy of its mask during the photolithography technique. Thus it can be shown structurally a drift region with large depth and large width. For some integration processes, an Nwell mask is not adopted, and the drift region of an NMOS device is a counter-part pattern of a Pwell. In these processes, a drift region depth for an NMOS device is controlled by the layout of the Pwell. While the depth of the drift region has a positive relationship with the layout space width of the Pwell. The layout space is the counter-part of the regions Pwell is not formed.

The NMOS 300 may further comprise an N-type Buried Layer (NBL) layer 36 between substrate 30 and body region 34.

Though MOSFET device 300 in FIG. 3 only shows a single transistor, a MOSFET device may comprises a plurality of identical transistors electrically coupled in parallel. For ease of description without departing from the spirit of the present invention, each MOSFET device described in the following embodiments is also illustrated with a single transistor.

Figure 4:
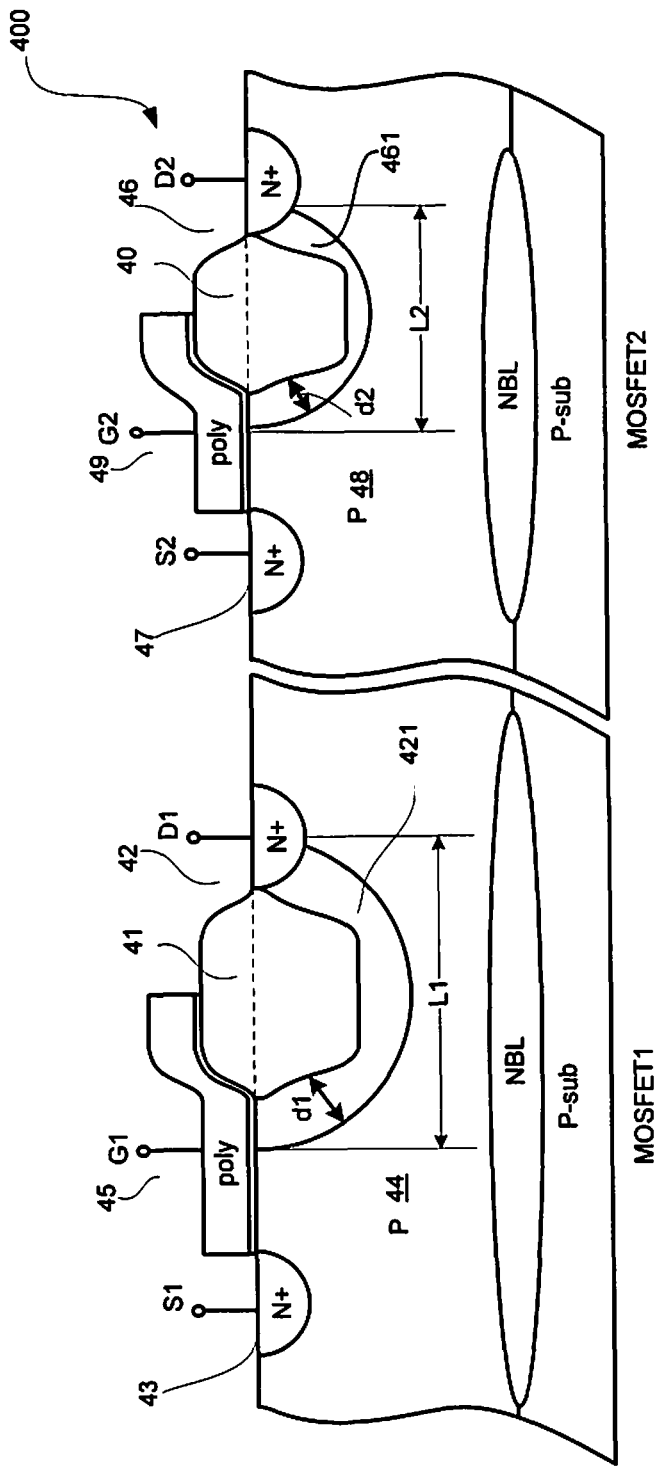
FIG. 4 shows a semiconductor device comprising a plurality of MOSFET devices with different drift region depths in accordance with an embodiment of the present invention.

FIG. 4 shows a semiconductor device 400 which comprises a plurality of NMOS devices according to an embodiment of the present invention. As shown in the figure, the semiconductor die 400 comprises a first MOSFET device MOSFET1 and a second MOSFET device MOSFET2. The first MOSFET device MOSFET1 comprises a first drain 42, a first source 43, a first body 44, a first gate 45 and a first recessed FOX structure 41. The first drain 42 comprises a drift region 421 having a first width L1 and a first drift region depth d1. And recessed FOX structure 41 makes the drift regions into a U shape. The second MOSFET device MOSFET2 comprises a second drain 46, a second source 47, a second body 48, a second gate 49 and a second recessed-FOX structure 40. The second drain 46 comprises a drift region 461 having a second width of L2 and a second depth d2. Meanwhile, the second recessed-FOX structure 40 makes the second drift region 461 into a U shape. While the first width L1 is wider than the second width L2 and recessed-FOX structures 41 and 40 have the substantially the same depth, the first depth d1 is deeper than the second depth d2. The recessed-FOX structures with "substantially same" depths are formed in the same etching process. And in one embodiment, the "substantially same" depths are defined that the difference of the two depths between two recessed-FOX structures is smaller than one fifths of the difference between the depths of the two corresponding drift region. When under the same biasing conditions for the gate, drain and source, the charge density of MOSFET1 is larger than that of MOSFET2.

The above embodiments relate to NMOS. However, P-type MOSFET devices with the opposite doping type are also in point of the present invention.

FIGS. 5A-5J illustrate a method of manufacturing a RESURF MOSFET with a U-shape drift region according to an embodiment of the present invention. In one embodiment, the method in FIGS. 5A-5J is compatible with a standard CMOS process. Firstly, forming an NBL layer on a substrate. Secondary, growing an epitaxial layer onto the surface. Then forming an Nwell into the epitaxial layer to form the drift region. Thereafter, a shallow trench is made and oxide is grown to form a recessed-FOX structure. And then gate are manufactured. Finally, N+ source contact region and drain contact region are manufactured. The method will be described in detail with reference to FIGS. 5A-5J.

Figure 5A:
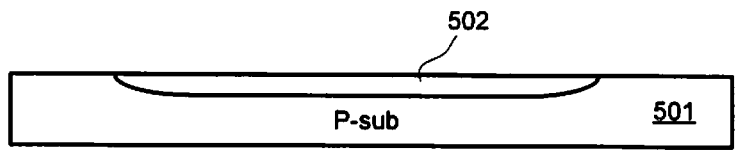
FIGS. 5A-5J illustrate a method of manufacturing a RESURF MOSFET device with a U-shape drift region whose depth is controlled by adjusting the layout width, according to an embodiment of the present invention.

In FIG. 5A, an NBL layer 502 is formed on a P-type substrate 501 such that the NBL layer 502 is under a MOSFET device. The formation of NBL layer 502 can adopt any suitable method. For not obscuring the inventive points, the detailed description of forming the NBL layer is not to be described.

Figure 5B:
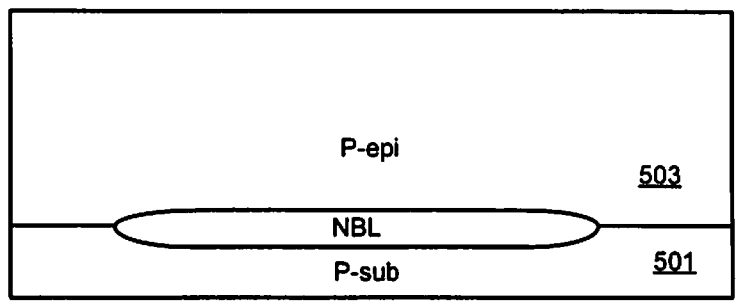

In FIG. 5B, a lightly doped P-type epitaxial layer 503 is formed on the NBL layer 502 and partly on the surface of the substrate 501. The term of "semiconductor substrate" can also refer to the combination of the P-type substrate 501 and the P-type epitaxial layer 503. In one embodiment, the epitaxial layer 503 forms the body of the MOSFET device. In another embodiment, an extra doping step is performed on the epitaxial layer to form the body of the MOSFET device.

Figure 5C:
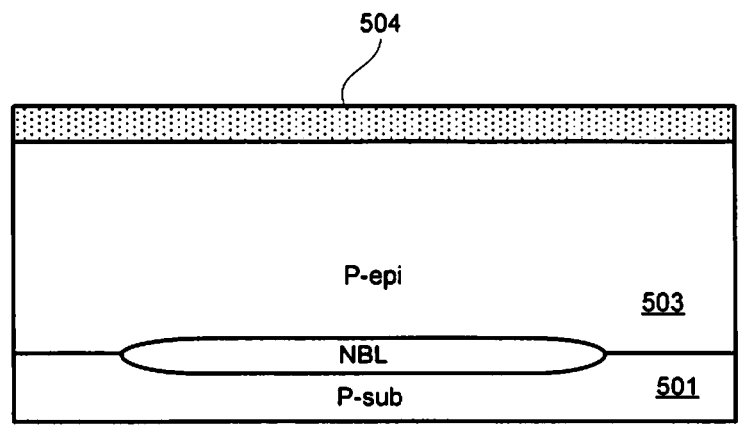
Figure 5D:
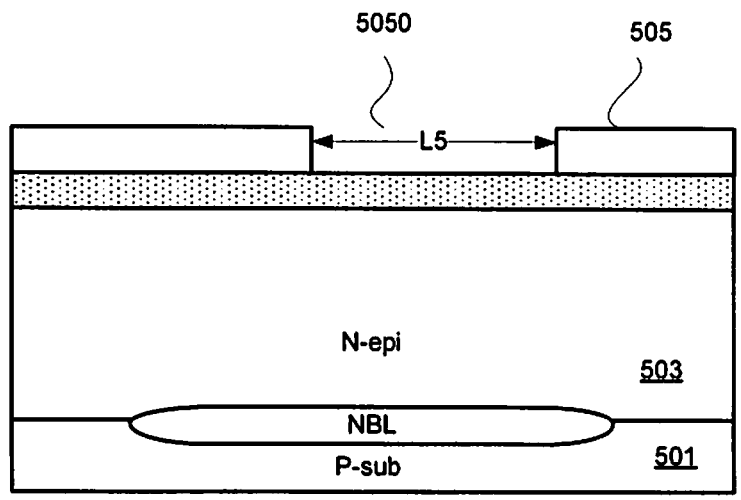
Figure 5E:
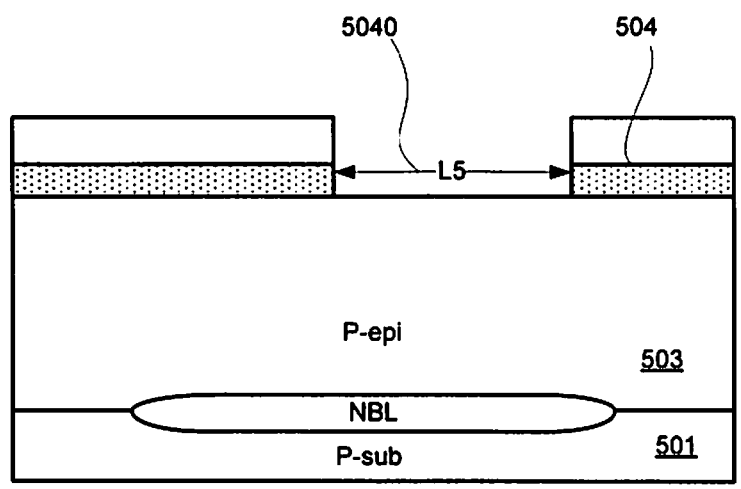

FIGS. 5C-5E refer to a photolithography process of forming an Nwell for the drift region of the MOSFET device and meanwhile controlling the depth of the Nwell. In FIG. 5C, a photoresist layer 504 is placed over the P-type epitaxial layer 503. Then in FIG. 5D, a mask 505 with an opening 5050 is placed above the photoresist layer 504. The depth of the Nwell for forming the drift region is controlled by adjusting the layout width of forming the drift region according to the phenomenon as described with reference to FIG. 2. The width L5 of the mask opening 5050 is calculated from the desired performance or the desired drift region depth of the MOSFET device. Given a fixed FOX depth and a fixed doping concentration, the performance of the MOSFET device such as the charge density at the RESURF region has a predetermined relationship with the depth of the RESURF depth, thus the layout width L5 of the mask opening 5050 may be calculated from the desired performance or the desired drift region depth of the MOSFET device. The layout width L5 of the drift region should have a positive relationship with the charge density. And then in FIG. 5E the photoresist layer 504 is patterned into an opening 5040 with the same width L5 as the mask opening 5050.

Figure 5F:
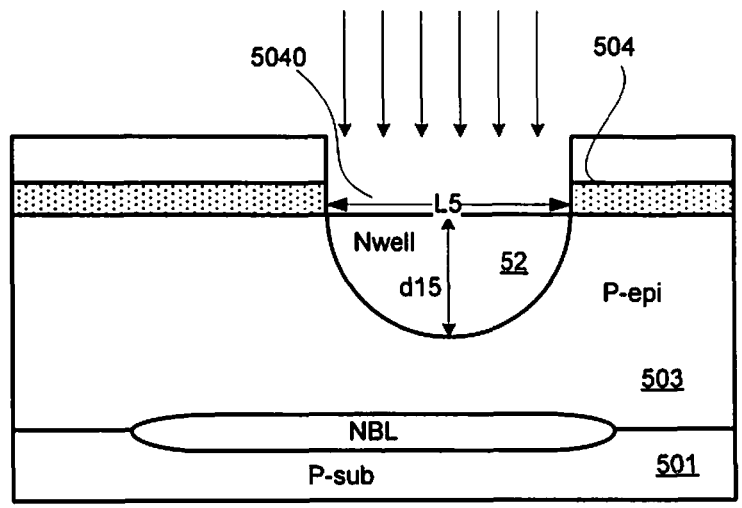

In FIG. 5F, N-type dopants are doped into the opening 5040 of the photoresist layer 504 to form an Nwell 52 under predetermined implantation conditions. In some embodiments, the predetermined implantation conditions are used also to form other Nwell or Nwells. The predetermined implantation conditions include predetermined implantation ion dose, energy, tilt, etc. And the implanted well is annealed at predetermined annealing conditions of predetermined temperature, time, gas etc. As described with reference to FIG. 2, the depth d15 of the Nwell 52 has a positive relationship with its width L5.

Figure 5G:
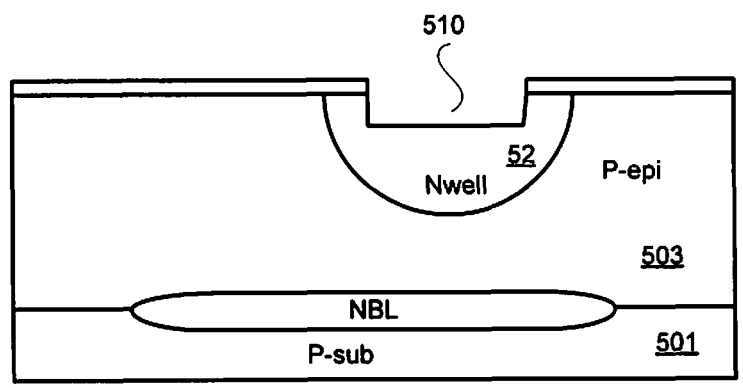

Then in FIG. 5G, a trench 510 is formed using an active mask as a first step of a recessed-FOX process. The shallow trench 510 is formed in Nwell 52 with an etching process. In one embodiment, forming trench 510 may include the steps of forming an oxide layer, forming a nitride layer, photolithography process and dry etching. If a deeper recessed-FOX structure is required, the etching time can be increased to achieve a deeper trench 510. A deeper trench 510 leads to a narrower drift region depth. Thus the depth of the trench can be adjusted with a negative relationship with the depth of the drift region and with a negative relationship with the charge density of the MOSFET device.

Figure 5H:
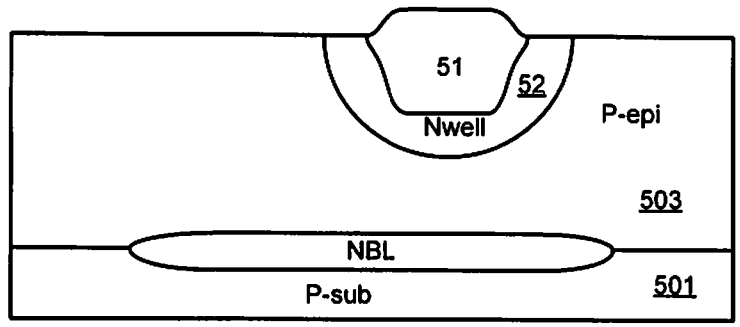

In the second step of the recessed-FOX process as illustrated in FIG. 5H, dielectric material such as oxide is grown in the trench to form the recessed-FOX structure 51 without an additional mask. Additional steps such as polishing of the surplus oxide, removal of the nitride layer may be performed thereafter. With the polishing step to remove the surplus oxide, the recessed-FOX structure 51 can be adjusted to the height of the silicon surface, thus better reliability is gained. The deep FOX structure 51 made with a recessed-FOX process leads to a U-shape drift region which prolongs the RESURF length and achieves a higher breakdown voltage.

Figure 5I:
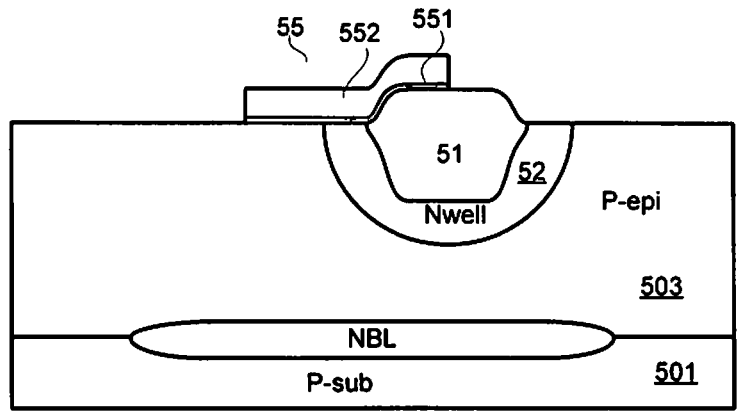
Figure 5J:
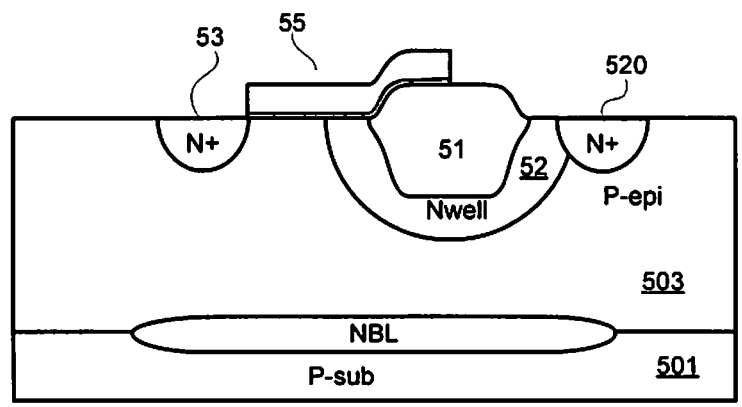

In the next step as shown in FIG. 5I, a gate is formed. First, a dielectric layer 551 is formed on the silicon surface. Then a polysilicon layer 552 is formed above the dielectric layer 551. Dielectric layer 551 and polysilicon layer 552 are patterned using photolithography technique and etching process to form the gate 55. The gate 55 is partly above the P-type layer 503, and partly above the drift region 52 and the recessed-FOX structure 51. And in FIG. 5J, further traditional steps are adopted to finalize the MOSFET device. For example, an additional mask is used to form the drain contact region 520 and the source contact region 53.

It should be noted that some steps are eliminated for ease of understanding and not obscuring the points of the invention.

FIGS. 6A-6G illustrate another method of manufacturing a RESURF MOSFET device. For this method, the depth of a drift region for an N-type MOSFET device is adjusted by the layout space width of a Pwell and the depth of a recessed-FOX structure.

Figure 6A:
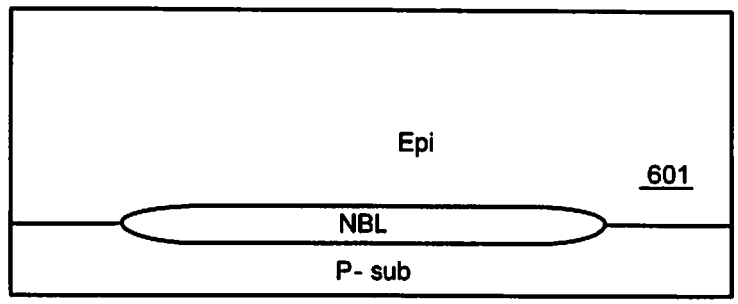
FIGS. 6A-6E illustrate another method of manufacturing a RESURF NMOS device with a U-shape drift region whose depth is controlled by the layout width of a Pwell of the body, according to an embodiment of the present invention.

As seen in FIG. 6A, an epitaxial layer 601 is formed on a semiconductor substrate. The semiconductor may comprise an NBL layer between the semiconductor substrate. The epitaxial layer 601 can be either light N-type or light P-type.

Figure 6B:
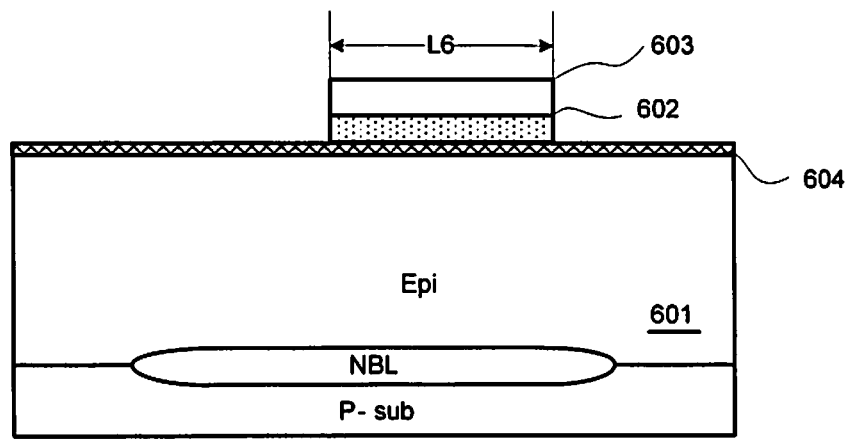

And then in FIG. 6B, a photolithography process is performed using a first mask 603 for forming a Pwell. A nitride layer 604 is deposited on the epitaxial layer 601 with silicon dioxide underneath (not shown). Then a photoresist layer 602 is placed onto the nitride layer 604 and is patterned with a mask 603. The mask 603 has a pattern whose width L6 (or called layout space width) is calculated from the performance requirement of the NMOS or the RESURF depth. If higher charge density is required, the layout space width L6 is adjusted larger. And if low charge density is required, the layout space width L6 is narrow.

Figure 6C:
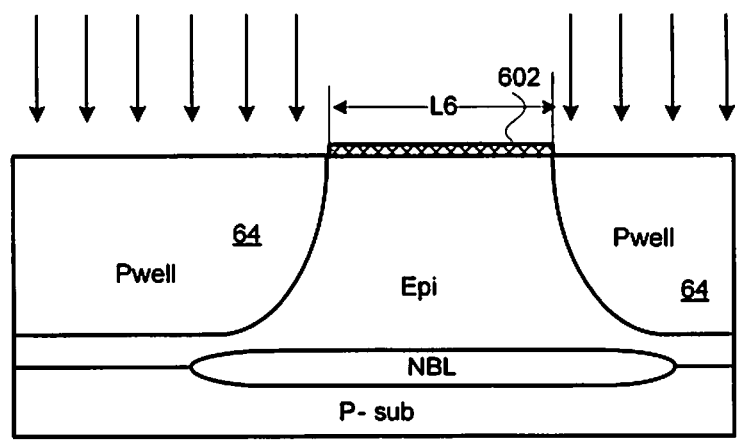

Next in FIG. 6C, the nitride layer 604 is etched as a hard mask for a Pwell 64 and P-type dopants are implanted to form the Pwell 64.

Figure 6D:
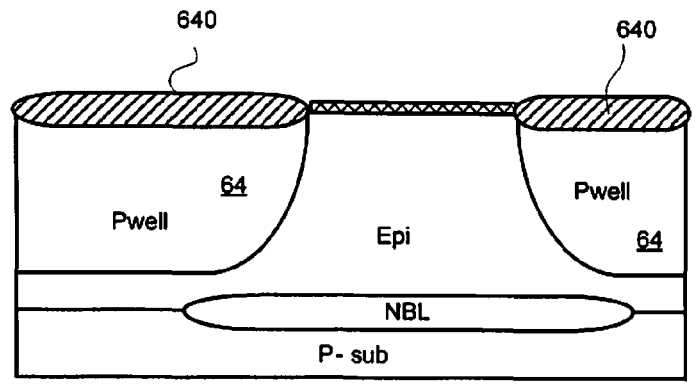

In FIG. 6D, a Pwell oxidation process is performed and a Pwell oxide 640 is grown on the surface of the Pwell 64.

Figure 6E:
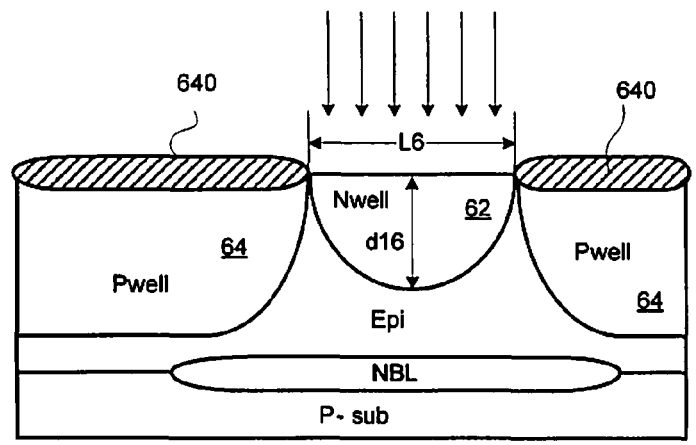

In FIG. 6E, the Pwell oxide 640 serves as the blocking mask for forming an Nwell 62 and N-type dopants such as phosphorous are implanted and self-aligned to the edge of the Pwell oxide 640. After Nwell implantation, the Pwell oxide 640 is moved away. Since the Nwell 62 is aligned to the edge of the Pwell 64, the layout space width L6 of the Pwell mask 603 determines the width of the Nwell 62. The layout space width L6 is a pattern of the mask where Pwell 64 is not formed and the layout space is for fabricating the Nwell 62. And further since the depth d16 of Nwell 62 has a positive relationship with its width L6, the space width of the Pwell mask 602 also determines the depth of the Nwell 62. Then a thermal annealing step is performed for well driving and Pwell is firmed under the Nwell 62.

Then a recessed-FOX structure is formed using a second mask. The steps of forming the recessed-FOX structure, the gate, etc. can be the same as described above referring to FIG. 5G-5J.

The RESURF depth or drift region depth of the NMOS device is controlled by the layout width of its drift region in the methods shown in FIGS. 5A-5J and controlled by the layout width of the Pwell G in the methods shown in FIG. 6A-6E. Thus when the NMOS device is integrated with other circuit or components in a semiconductor substrate, the particular drift charge of the RESURF-NMOS device does not require an additional mask.

The embodiments shown in FIGS. 5A-6E are only for illustration only, and some well-known process steps and layers are omitted for simplicity, so as not to unnecessarily obscure aspects of the present invention.

Though the semiconductor regions of the above embodiments are shown in either N-type or P-type, the doping type can be the opposite.

In one embodiment, the N-type regions can optionally be doped with the phosphorous, arsenic and/or antimony and the P-type regions can optionally be doped with boron, aluminum and/or gallium.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

I claim:

1. A semiconductor device comprising a Metal Oxide Semiconductor Field Effect Transistor (MOSFET) device, wherein the MOSFET device comprises:
    a drain of a first doping type, wherein the drain comprises a drain contact region and a drift region, and wherein the drift region has a width and a depth;
    a source of a first doping type;
    a body of a second doping type, wherein the body is between the drain and the source;
    a gate above the body, wherein the drain is at one side of the gate and the source is at another side of the gate; and
    a recessed Field Oxide (recessed-FOX) structure, wherein the recessed-FOX structure is between the gate and the drift region vertically and wherein the recessed-FOX structure is between the body and the drain contact region laterally, and wherein the recessed-FOX structure is configured to make the drift region into a U shape, wherein the depth of the drift region has a positive relationship with the width of the drift region.

2. The semiconductor device of claim 1, wherein the depth of the drift region has a negative relationship with the depth of the recessed-FOX structure.

3. The semiconductor device of claim 1 is integrated into a semiconductor substrate, wherein the semiconductor device is of a second doping type.

4. The semiconductor device of claim 3, wherein the semiconductor device further comprises a buried layer, wherein the buried layer is of a first doping type and wherein the buried layer is between the semiconductor substrate and the MOSFET device.

5. The semiconductor device of claim 1 wherein the first doping type is N doping type and the second doping type is P doping type.

6. The semiconductor device of claim 1 wherein the MOSFET device is a first MOSFET device comprising a first drift region and a first recessed-FOX structure, wherein the first drift region has a first width and a first depth, and wherein the semiconductor device further comprises a second MOSFET device comprising a second source, a second drain, a second body, a second gate and a second recessed-FOX structure, and wherein:
    the depth of the first recessed-FOX structure and the depth of the second recessed-FOX structure are substantially the same;
    the second drain comprises a second drift region having a second width and a second depth; and
    wherein the first width is greater than the second width, and wherein the first depth is greater than the second depth.

7. The semiconductor device of claim 6 wherein the difference between the first recessed-FOX structure and the second recessed-FOX structure is less than one fifths of the difference between the first depth and the second depth.

8. The semiconductor device of claim 6 wherein when the first MOSFET device and the second MOSFET device are under the same biasing conditions, the charge density of the first MOSFET device is greater that the charge density of the second MOSFET device.

9. The semiconductor device of claim 8 wherein the same biasing conditions comprise the same gate voltages, the same drain voltages and the same source voltages applied on the first MOSFET device and the second MOSFET device.

* * * * *